United States Patent
Kumar (10) Patent No.: US 7,718,539 B2
(45) Date of Patent: May 18, 2010

(54) METHOD FOR PHOTOMASK FABRICATION UTILIZING A CARBON HARD MASK

(75) Inventor: Ajay Kumar, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 488 days.

(21) Appl. No.: 11/565,271

(22) Filed: Nov. 30, 2006

(65) Prior Publication Data

US 2008/0280212 A9    Nov. 13, 2008

Related U.S. Application Data

(63) Continuation of application No. 11/238,424, filed on Sep. 28, 2005, now Pat. No. 7,375,038.

(51) Int. Cl.
*H01L 21/302* (2006.01)

(52) U.S. Cl. .................. 438/717; 438/714; 438/727; 430/316

(58) Field of Classification Search .............. 438/706, 438/710, 712, 714, 720, 717, 723, 725; 430/316, 430/318
See application file for complete search history.

(56) References Cited

U.S. PATENT DOCUMENTS

| | | | |
|---|---|---|---|
| 4,579,618 A | 4/1986 | Celestino et al. | |
| 4,585,516 A | 4/1986 | Corn et al. | |
| 5,273,610 A | 12/1993 | Thomas, III et al. | |
| 5,472,564 A | 12/1995 | Nakamura et al. | |
| 5,512,130 A | 4/1996 | Barna et al. | |
| 5,556,501 A | 9/1996 | Collins et al. | |
| 5,689,215 A | 11/1997 | Richardson et al. | |
| 5,840,200 A * | 11/1998 | Nakagawa et al. | 216/6 |
| 5,899,252 A | 5/1999 | Pozzo | |
| 6,060,132 A | 5/2000 | Lee | |
| 6,089,181 A | 7/2000 | Suemasa et al. | |
| 6,171,764 B1 | 1/2001 | Ku et al. | |
| 6,228,760 B1 | 5/2001 | Yu et al. | |
| 6,252,354 B1 | 6/2001 | Collins et al. | |
| 6,259,334 B1 | 7/2001 | Howald | |
| 6,354,240 B1 | 3/2002 | De Ornellas et al. | |
| 6,391,794 B1 | 5/2002 | Chen et al. | |
| 6,451,705 B1 | 9/2002 | Trapp et al. | |
| 6,500,756 B1 | 12/2002 | Bell et al. | |
| 6,552,297 B2 | 4/2003 | Blonigan et al. | |

(Continued)

FOREIGN PATENT DOCUMENTS

EP    0 553 704    1/1993

(Continued)

OTHER PUBLICATIONS

Extended European Search Report dated Jul. 9, 2008 for EP Application No. 06253960.6. (APPM/010364-EP).

(Continued)

*Primary Examiner*—Lan Vinh
(74) *Attorney, Agent, or Firm*—Patterson & Sheridan, LLP (57) ABSTRACT

Methods for forming a photomask using a carbon hard mask are provided. In one embodiment, a method of forming a photomask includes etching a chromium layer through a patterned carbon hard mask layer in the presence of a plasma formed from a process gas containing chlorine and carbon monoxide.

18 Claims, 5 Drawing Sheets

U.S. PATENT DOCUMENTS

| | | |
|---|---|---|
| 6,573,030 B1 | 6/2003 | Fairbairn et al. |
| 6,607,984 B1 | 8/2003 | Lee et al. |
| 6,617,794 B2 | 9/2003 | Barnes et al. |
| 6,635,185 B2 * | 10/2003 | Demmin et al. ............... 216/64 |
| 6,635,583 B2 | 10/2003 | Bencher et al. |
| 6,638,855 B1 | 10/2003 | Chang et al. |
| 6,642,149 B2 | 11/2003 | Suemasa et al. |
| 6,790,770 B2 | 9/2004 | Chen et al. |
| 6,864,020 B1 | 3/2005 | Taravade et al. |
| 6,887,339 B1 | 5/2005 | Goodman et al. |
| 7,375,038 B2 | 5/2008 | Kumar |
| 2001/0013313 A1 | 8/2001 | Droopad et al. |
| 2002/0197509 A1 | 12/2002 | Carcia et al. |
| 2003/0077910 A1 * | 4/2003 | Westerman et al. ......... 438/714 |
| 2003/0091938 A1 | 5/2003 | Fairbairn et al. |
| 2003/0186137 A1 | 10/2003 | Chan |
| 2004/0209477 A1 | 10/2004 | Buxbaum et al. |
| 2005/0011862 A1 * | 1/2005 | Sasaki et al. ................... 216/67 |
| 2005/0018604 A1 | 1/2005 | Dropps et al. |
| 2005/0019674 A1 * | 1/2005 | Okubo et al. ................... 430/5 |
| 2005/0078953 A1 | 4/2005 | Fodor et al. |
| 2005/0082007 A1 | 4/2005 | Nguyen et al. |
| 2005/0090118 A1 | 4/2005 | Shannon et al. |
| 2005/0133163 A1 | 6/2005 | Shannon et al. |
| 2005/0181604 A1 | 8/2005 | Sperlich et al. |
| 2006/0228473 A1 | 10/2006 | Satoh et al. |
| 2007/0023390 A1 | 2/2007 | Kumar |
| 2007/0026321 A1 | 2/2007 | Kumar |
| 2007/0119373 A1 | 5/2007 | Kumar |
| 2008/0050661 A1 | 2/2008 | Kumar |

FOREIGN PATENT DOCUMENTS

| | | |
|---|---|---|
| EP | 0 840 350 | 5/1998 |
| EP | 1011135 | 6/2000 |
| EP | 1 215 710 | 6/2002 |
| EP | 1 612 840 | 1/2006 |
| JP | 58-019476 | 2/1983 |
| JP | 05-090226 | 4/1993 |
| JP | 06 243992 | 9/1994 |
| JP | 03 073836 | 3/2003 |
| WO | 99 043017 | 8/1999 |
| WO | 03 043061 | 5/2003 |
| WO | 2003036704 | 5/2003 |
| WO | 2004006014 | 1/2004 |

OTHER PUBLICATIONS

J. Staples, et al., "High-Efficiency Matching Network for RF-Driven Ion Sources." Proceedings of the 2001 Particle Accelerator Conference, Chicago, IEEE 2001; pp. 2108-2110.

"PCT International Search Report and Written Opinion for PCT/US2004/039081,Applied Materials, Inc., dated Aug. 3, 2005."

Yoda Takashi, et al., "High-Performance SiOF Film Fabricated Using A Dual-Frequency-Plasma Chemical Vapour Deposition System." Japanese Journal of Applied Physics, vol. 43, No. 9A, Sep. 9, 2004, pp. 5984-5989.

Bencher, et al., "Dielectric Antireflective Coatings for DUV Lithography", Solid State Technology, Mar. 1997, 109, 111-112 and 114.

Gwyn, et al., "Extreme Utraviolet Scanning Lithography—Supports Extension of Moore's Law", Issue 11, 8 Pgs.

Japanese Office Action for JP Application No. 2006-244594, dated Sep. 29, 2009 (APPM/010365JP).

* cited by examiner

METHOD FOR PHOTOMASK FABRICATION UTILIZING A CARBON HARD MASK

CROSS-REFERENCE TO RELATED APPLICATIONS

This application is a continuation of U.S. patent application Ser. No. 11/238,424, filed Sep. 28, 2005 now U.S. Pat. No. 7,375,038, which is herein incorporated by reference in its entirety.

BACKGROUND OF THE INVENTION

1. Field of the Invention

The present invention generally relates to a method for plasma etching chromium. More specifically, the present invention provides a method for etching chromium layer through a carbon hard mask for photomask fabrication.

2. Description of the Related Art

In the manufacture of integrated circuits (IC), or chips, patterns representing different layers of the chip are created by a chip designer. A series of reusable masks, or photomasks, are created from these patterns in order to transfer the design of each chip layer onto a semiconductor substrate during the manufacturing process. Mask pattern generation systems use precision lasers or electron beams to image the design of each layer of the chip onto a respective mask. The masks are then used much like photographic negatives to transfer the circuit patterns for each layer onto a semiconductor substrate. These layers are built up using a sequence of processes and translate into the tiny transistors and electrical circuits that comprise each completed chip. Thus, any defects in the mask may be transferred to the chip, potentially adversely affecting performance. Defects that are severe enough may render the mask completely useless. Typically, a set of 15 to 30 masks is used to construct a chip and can be used repeatedly.

A mask is typically a glass or a quartz substrate that has a layer of chromium on one side. The mask may also contain a layer of silicon nitride (SiN) doped with molybdenum (Mb). The chromium layer is covered with an anti-reflective coating and a photosensitive resist. During a patterning process, the circuit design is written onto the mask by exposing portions of the resist to ultraviolet light, making the exposed portions soluble in a developing solution. The soluble portion of the resist is then removed, allowing the exposed underlying chromium to be etched. The etch process removes the chromium and anti-reflective layers from the mask at locations where the resist was removed, i.e., the exposed chromium is removed.

Another mask utilized for patterning is known as a quartz phase shift mask. The quartz phase shift mask is similar to the mask described above, except that alternating adjacent areas of quartz regions exposed through the patterned chromium layer are etched to a depth about equal to half the wavelength of light which will be utilized to transfer the circuit patterns to a substrate during fabrication. Thus, as the light is shown through the quartz phase shift mask to expose resist disposed on the substrate, the light impinging in the resist through one opening in the mask is 180 degrees out of phase relative to the light passing through the immediately adjacent opening. Therefore, light that may be scattered at the edges of the mask opening is cancelled out by the 180 degree light scattering at the edge of the adjacent opening, causing a tighter distribution of light in a predefined region of the resist. The tighter distribution of light facilitates writing of features having smaller critical dimensions. Similarly, masks used for chromeless etch lithography also utilize the phase shift of light passing through quartz portions of two masks to sequentially image the resist, thereby improving the light distribution utilized to develop the resist pattern.

In one etch process, known as dry etching, reactive ion etching, or plasma etching, plasma is used to enhance a chemical reaction and etch the patterned chromium area of the mask. Unfortunately, conventional chromium etch processes often suffer etch bias problems due to attack on the photoresist material utilized to pattern the chromium. As the photoresist is attacked during the chromium etch, the critical dimension of patterned photoresist is not accurately transferred to the chromium layer. Additionally, since etching using a photoresist mask is subject to etch bias, the use of photoresist masks for fabricating critical dimensions less than about 5 μm is extremely challenging to the fabricator as these problems result in non-uniformity of the etched features of the photomask and correspondingly diminishes the ability to produce features having small critical dimensions using the mask. As the critical dimensions of mask continue to shrink, the importance of etch uniformity dominates.

Hard masks have been recently used to provide more accurate critical dimension (CD) transfer during chromium etching for photomask fabrication. However, existing chromium etch processes have poor selectivity to carbon hard mask materials. As conventional chromium etch chemistries include oxygen, carbon hard mask materials are often etched as fast or faster than the chromium layers, resulting in unacceptable CD control, thus, making conventional chromium etch processes unsuitable for photomask fabrication.

Therefore, there is a need for a chromium etch process having high etching selectivity to carbon hard mask materials.

SUMMARY OF THE INVENTION

The present invention generally provides a method for etching a chromium layer using a carbon hard mask. In one embodiment, a method of forming a photomask includes providing a substrate having a patterned carbon hard mask disposed over a chromium layer and a quartz layer on a substrate support disposed in a processing chamber, introducing a process gas containing chlorine and carbon monoxide into the processing chamber, forming a plasma of the process gas, biasing the substrate, etching the chromium layer exposed through said patterned carbon hard mask to expose portions of the quartz layer, and removing the hard mask layer.

In another embodiment, a method of etching a chromium layer includes providing a substrate having a chromium layer partially exposed through a patterned carbon hard mask layer, flowing a process gas containing chlorine and carbon monoxide into a processing chamber, and maintaining a plasma of the process gas to etch the chromium layer though the patterned carbon hard mask layer.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Embodiments of the present invention provide an improved chromium etching process and a method for photomask fabrication. The methods utilize a chromium etch chemistry which has high selectivity to carbon hard mask materials.

Figure 1:
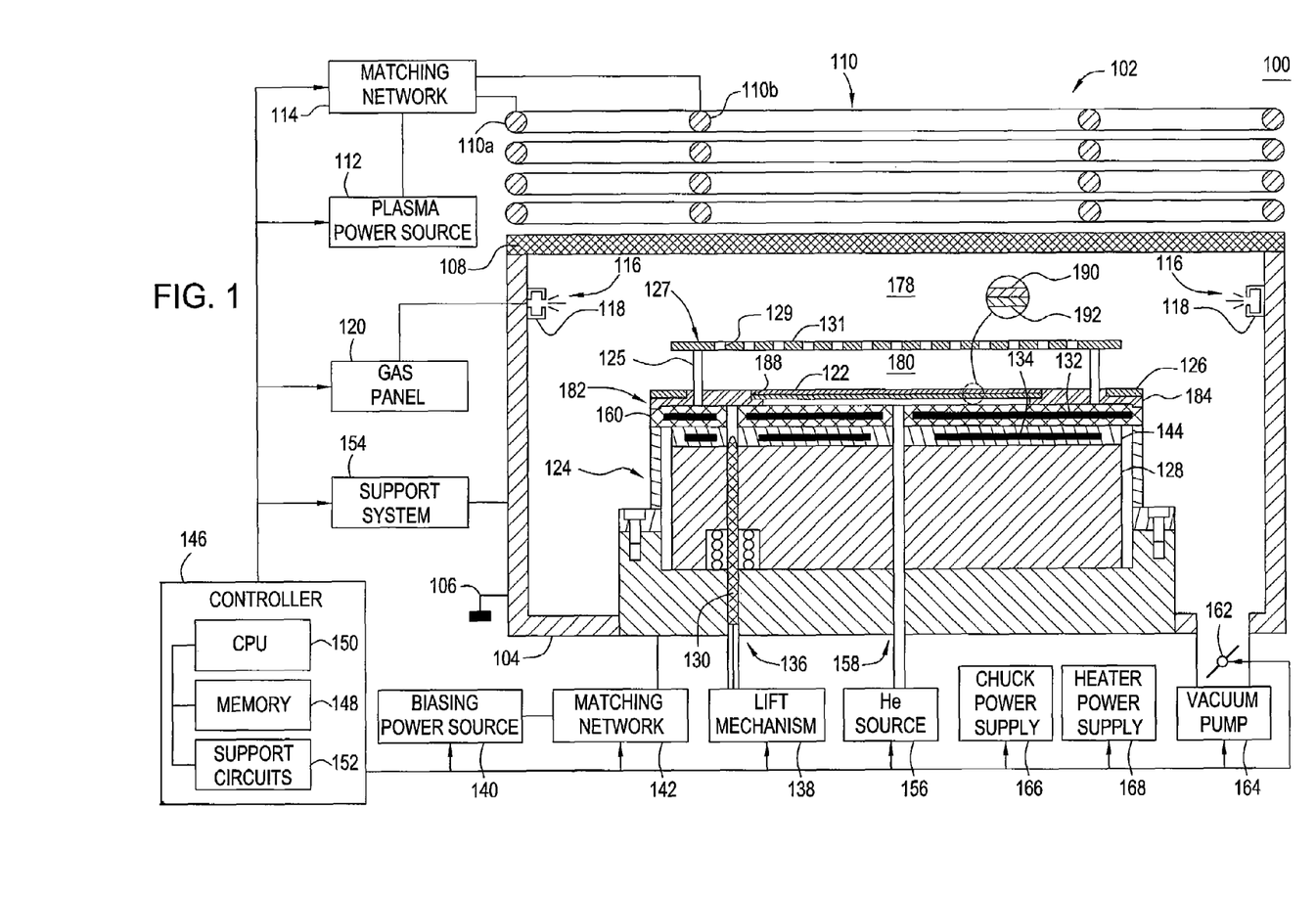
FIG. 1 is a schematic sectional view of one embodiment of an etch reactor suitable for etching a chromium layer.
Figure 4:
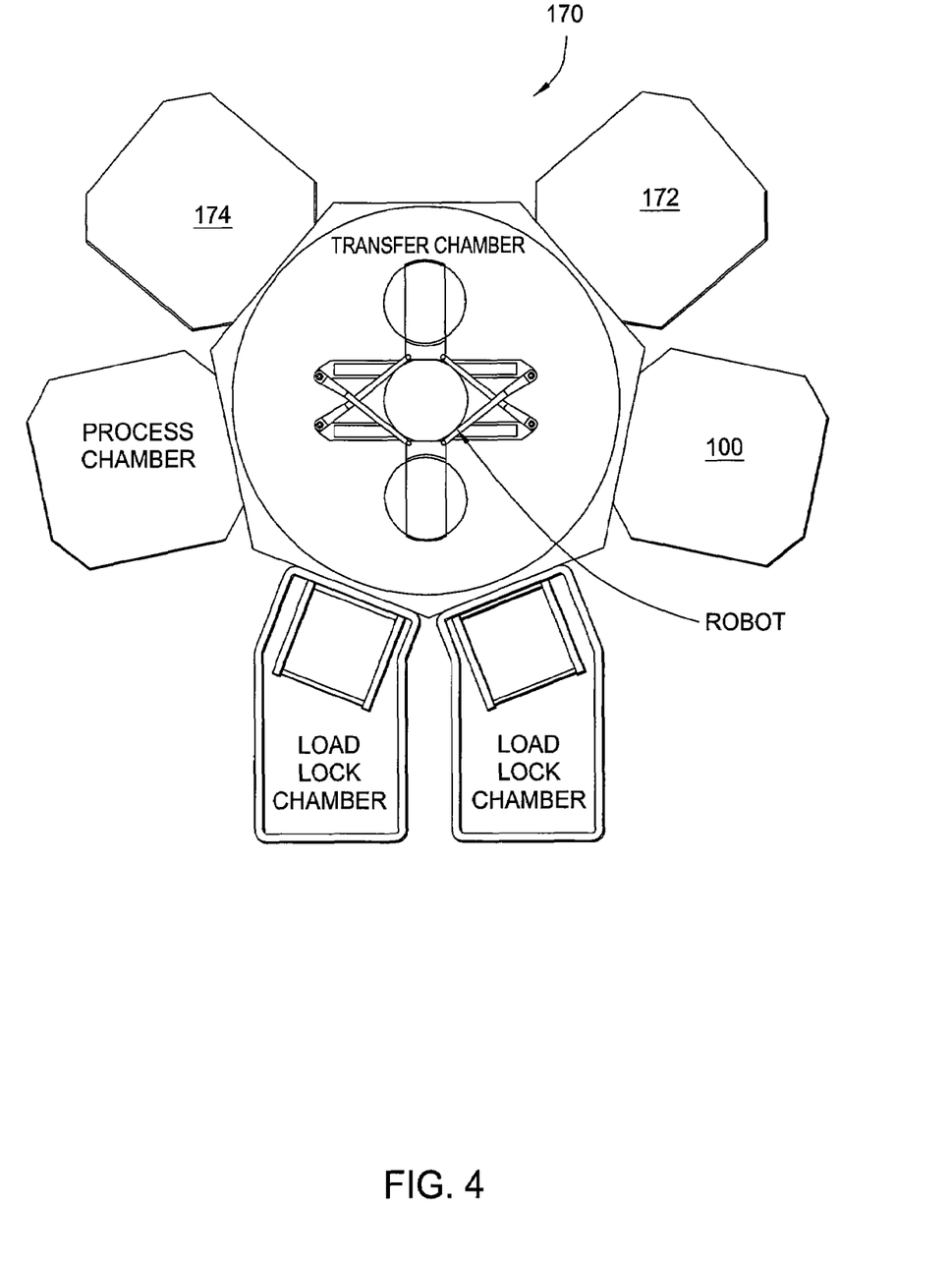
FIG. 4 is a schematic diagram of one embodiment of a processing system, e.g., a cluster tool, including the reactor of FIG. 1.

FIG. 1 depicts a schematic diagram of one embodiment of an etch processing chamber 100 in which a method of chromium etching of the present invention may be practiced. Suitable reactors that may be adapted for use with the teachings disclosed herein include, for example, the Decoupled Plasma Source (DPS®) II reactor, or the Tetra I and Tetra II Photomask etch systems, all of which are available from Applied Materials, Inc. of Santa Clara, Calif. The etch processing chamber 100 may also be used as a processing module of a processing system 170 as shown in FIG. 4, such as, for example, a Centura® integrated semiconductor wafer processing system, also available from Applied Materials, Inc. The processing system may also include a first chamber 172 suitable for ashing and a second chamber suitable for polymer deposition 174. Examples of suitable ashing and deposition chambers include AXIOM HT™ and Tetra II processing chambers, also available from Applied Materials, Inc. The particular embodiment of the processing chamber 100 shown herein is provided for illustrative purposes and should not be used to limit the scope of the invention.

The processing chamber 100 generally comprises a process chamber body 102 having a substrate pedestal 124, and a controller 146. The chamber body 102 has a conductive wall 104 that supports a substantially flat dielectric ceiling 108. Other embodiments of the processing chamber 100 may have other types of ceilings, e.g., a dome-shaped ceiling. An antenna 110 having one or more inductive coils, such as two co-axial elements 110A and 110B, is disposed above the ceiling 108. The coaxial elements 110A and 110B may be selectively controlled. The antenna 110 is coupled through a first matching network 114 to a plasma power source 112. The plasma power source 112 is typically capable of producing up to about 3000 Watts (W) at a tunable frequency in a range from about 50 kHz to about 13.56 MHz. In one embodiment, the plasma power source 112 provides about 100 to about 600 W of inductively coupled RF power, and in another embodiment, the plasma power source 112 provides about 250 to about 600 W of inductively coupled RF power.

The substrate pedestal (cathode) 124 is coupled through a second matching network 142 to a biasing power source 140. The biasing source 140 provides between about zero to about 600 W at a tunable pulse frequency in the range of about 1 to about 10 kHz. The biasing source 140 is capable of producing a pulsed RF power output. Alternatively, the biasing source 140 may produce a pulsed DC power output. It is contemplated that the source 140 may also be configured to provide a constant DC and/or RF power output.

In one embodiment, the biasing source 140 is configured to provide pulsed RF power less than about 600 Watts at a frequency between about 1 to about 10 kHz, with a duty cycle between about 10 to about 95 percent. In another embodiment, the biasing source 140 is configured to provide pulsed RF power between about 10 to about 150 W, at a frequency between about 2 to about 5 kHz, with a duty cycle between about 80 to about 95 percent. In yet another embodiment, the biasing source provides a pulsed RF power of about 10 W.

In one embodiment configured as a DPS® reactor, the substrate support pedestal 124 includes an electrostatic chuck 160. The electrostatic chuck 160 comprises at least one clamping electrode 132 and is controlled by a chuck power supply 166. In alternative embodiments, the substrate pedestal 124 may comprise substrate retention mechanisms such as a susceptor clamp ring, a mechanical chuck, and the like.

A gas panel 120 is coupled to the processing chamber 100 to provide process and/or other gases to the interior of the chamber body 102. In the embodiment depicted in FIG. 1, the gas panel 120 is coupled to one or more inlets 116 formed in a channel 118 in the sidewall 104 of the chamber body 102. It is contemplated that the one or more inlets 116 may be provided in other locations, for example, in the ceiling 108 of the processing chamber 100.

In one embodiment, the gas panel 120 is adapted to provide process gas through the inlets 116 and into the interior of the chamber body 102. During processing, a plasma is formed of the process gas in the chamber body 102 and maintained through inductive coupling of power from the plasma power source 112. The plasma may alternatively be formed remotely or ignited by other methods. In one embodiment, the process gas provided from the gas panel 120 includes at least one chlorine containing gas and carbon monoxide (CO) gas. Examples of chlorine containing gases include $Cl_2$, $BCl_3$, and HCl, among others.

The pressure in the processing chamber 100 is controlled using a throttle valve 162 and a vacuum pump 164. The vacuum pump 164 and throttle valve 162 are capable of maintaining chamber pressures in the range of about 1 to about 20 mTorr.

The temperature of the wall 104 may be controlled using liquid-containing conduits (not shown) that run through the wall 104. Wall temperature is generally maintained at about 65 degrees Celsius. Typically, the chamber wall 104 is formed from a metal (e.g., aluminum, stainless steel, and the like) and is coupled to an electrical ground 106. The processing chamber 100 also comprises conventional systems for process control, internal diagnostic, end point detection, and the like. Such systems are collectively shown as support systems 154.

A reticle adapter 182 is used to secure a substrate (such as a reticle or other workpiece) 122 onto the substrate support pedestal 124. The reticle adapter 182 generally includes a lower portion 184 milled to cover an upper surface of the pedestal 124 (for example, the electrostatic chuck 160) and a top portion 186 having an opening 188 that is sized and shaped to hold the substrate 122. The opening 188 is generally substantially centered with respect to the pedestal 124. The adapter 182 is generally formed from a single piece of etch resistant, high temperature resistant material such as polyimide ceramic or quartz. A suitable reticle adapter is disclosed in U.S. Pat. No. 6,251,217, issued on Jun. 26, 2001, and incorporated herein by reference. An edge ring 126 may cover and/or secure the adapter 182 to the pedestal 124.

A lift mechanism 138 is used to lower or raise the adapter 182, and hence, the substrate 122, onto or off of the substrate support pedestals 124. Generally, the lift mechanism 162 comprises a plurality of lift pins (one lift pin 130 is shown) that travel through respective guide holes 136.

In operation, the temperature of the substrate 122 is controlled by stabilizing the temperature of the substrate pedestal 124. In one embodiment, the substrate support pedestal 124 comprises a heater 144 and an optional heat sink 128. The heater 144 may be one or more fluid conduits configured to flow a heat transfer fluid therethrough. In another embodiment, the heater 144 may include at least one heating element 134 that is regulated by a heater power supply 168. Optionally, a backside gas (e.g., helium (He)) from a gas source 156 is provided via a gas conduit 158 to channels that are formed in the pedestal surface under the substrate 122. The backside gas is used to facilitate heat transfer between the pedestal 124 and the substrate 122. During processing, the pedestal 124 may be heated by the embedded heater 144 to a steady-state temperature, which in combination with the helium backside gas, facilitates uniform heating of the substrate 122.

The controller 146 comprises a central processing unit (CPU) 150, a memory 148, and support circuits 152 for the CPU 150 and facilitates control of the components of the processing chamber 100 and, as such, of the etch process, as discussed below in further detail. The controller 146 may be one of any form of general-purpose computer processor that can be used in an industrial setting for controlling various chambers and sub-processors. The memory 148 of the CPU 150 may be one or more of readily available memory such as random access memory (RAM), read only memory (ROM), floppy disk, hard disk, or any other form of digital storage, local or remote. The support circuits 152 are coupled to the CPU 150 for supporting the processor in a conventional manner. These circuits include cache, power supplies, clock circuits, input/output circuitry and subsystems, and the like. The inventive method is generally stored in the memory 148 or other computer-readable medium accessible to the CPU 150 as a software routine. Alternatively, such software routine may also be stored and/or executed by a second CPU (not shown) that is remotely located from the hardware being controlled by the CPU 150.

Figure 2:
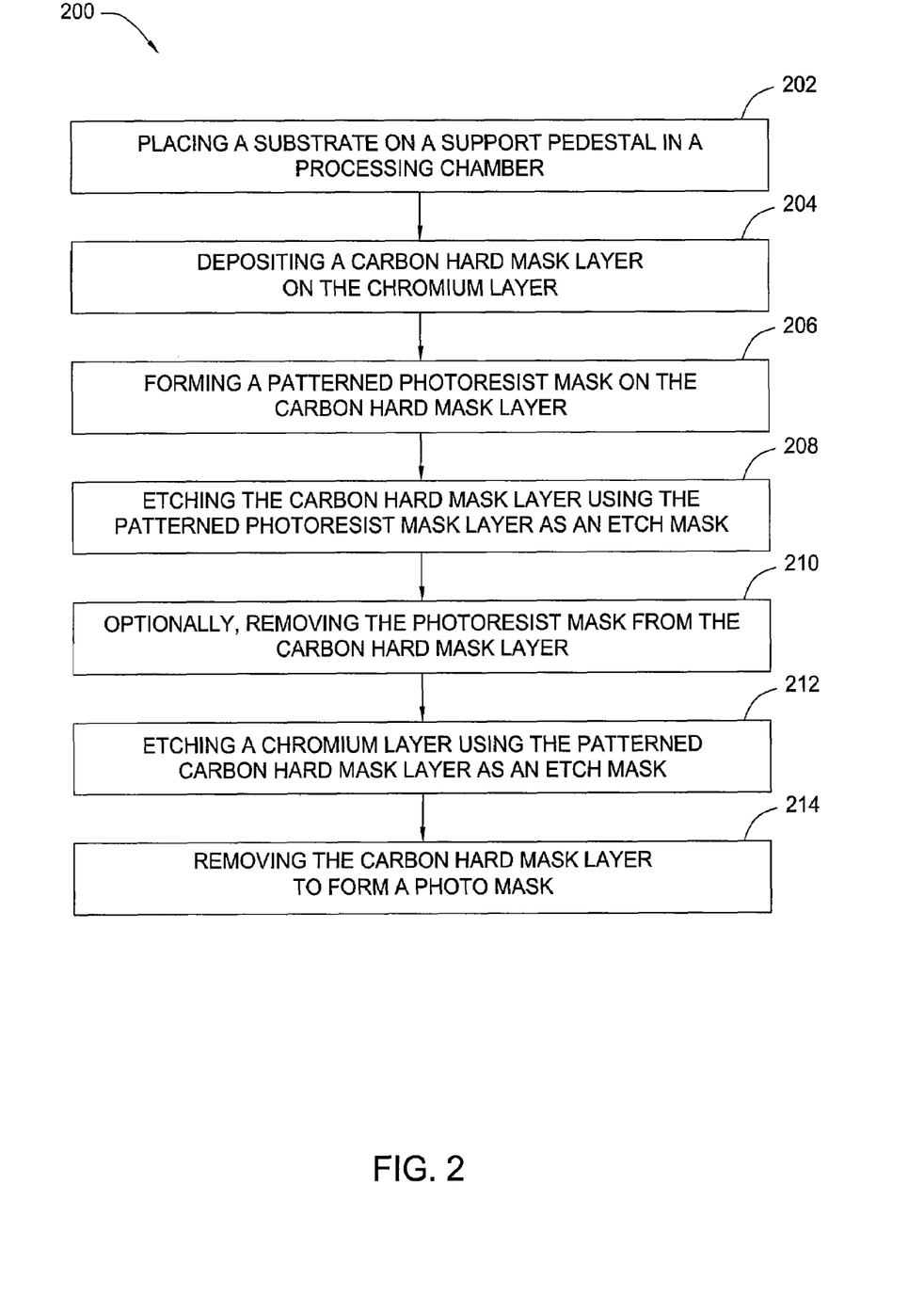
FIG. 2 depicts one embodiment of a flow diagram for a method of fabricating a photomask in accordance with one embodiment of the present invention.

FIG. 2 depicts one embodiment of a flow diagram for a method 200 of fabricating a photomask 320 as shown in FIGS. 3A-G in accordance with one embodiment of the present invention. The method 200 is generally stored in the memory 148, typically as a software routine. Although the method 200 of the present invention is discussed as being implemented as a software routine, some or all of the method steps that are disclosed therein may be performed in hardware as well as by the software controller. As such, the invention may be implemented in software as executed upon a computer system, in hardware as an application specific integrated circuit or other type of hardware implementation, or a combination of software and hardware.

Figure 3A:
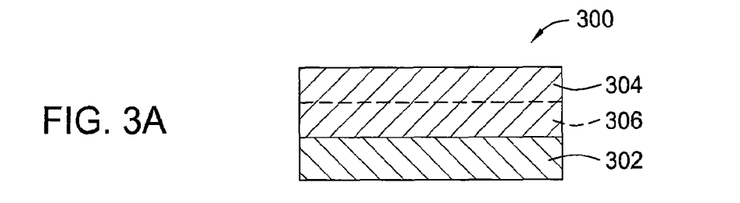
FIGS. 3A-3G depict a series of schematic, partial cross-sectional views of a film stack fabricated into a photomask accordance with the method of FIG. 2.

The method 200 begins at step 202 when substrate 122 is placed on a support pedestal 124. The substrate 122 generally comprises a film stack 300 of the photomask structure being fabricated. The film stack 300 includes an optically transparent silicon based material, such as quartz (i.e., silicon dioxide (SiO2)) layer 302, having an opaque light-shielding chromium layer 304, known as a photomask material, processed to form a patterned mask on the surface of the quartz layer 302. The chromium layer 304 may be chromium and/or chromium oxynitride. The substrate 122 may also include an attenuating layer 306 (shown in phantom), such as silicon nitride (SiN) doped with molybdenum (Mo) or Molybdenum silicon (MoSi), interposed between the quartz layer 302 and chromium layer 304, as shown in FIG. 3A.

Figure 3B:
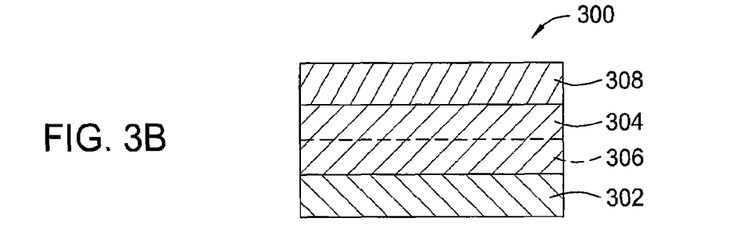

At step 204, a carbon hard mask layer 308 is deposited on the substrate 122 utilizing a chemical vapor depositing process as shown in FIG. 3B. The carbon hard mask layer 308 has a thickness of, but not limited to, about 50 Å to about 1000 Å. The carbon hard mask layer 308 may be a high-temperature inorganic carbon material, referred to as a-carbon. In another embodiment, the mask layer 308 may be a material sold under trade name Advanced Patterning Film (APF™), by Applied Materials, Inc., located in Santa Clara, Calif.

In one embodiment, a carbon hard mask layer 308 is deposited by heating a gas mixture comprising one or more hydrocarbon compounds and an inert gas to thermally decompose the one or more hydrocarbon compounds and an inert gas to thermally decompose the one or more hydrocarbon compounds in the gas mixture to form an amorphous carbon layer. Suitable hydrocarbon compounds include gases having the general formula $C_xH_y$, wherein x has a range of 2 to 4 and y has a range of 2 to 10. The gas mixture may be heated to a temperature between about 100 to about 700° C. During deposition, a bias power may be configured to engineer the stress of the deposited material to improve adhesion of the hard mask layer 308 to the underlying film. Particularly, as the critical dimensions of the photomask approach the 45 nm range, poor adherence of the carbon hard mask layer 308 which promotes etch bias will result in unacceptable transfer of CDs from the masking materials to the photomask.

In one embodiment, the carbon hard mask layer 308 may include a dielectric anti-reflective coating (DARC) layer used to control the reflection of light during a lithographic patterning process. Typically, the DARC layer comprises silicon dioxide ($SiO_2$), silicon oxynitride (SiON), silicon nitride ($Si_3N_4$), and the like. In one illustrative embodiment, a hard mask layer includes α-carbon film and a DARC layer having a combined thickness of about 1800 Angstroms.

Figure 3C:
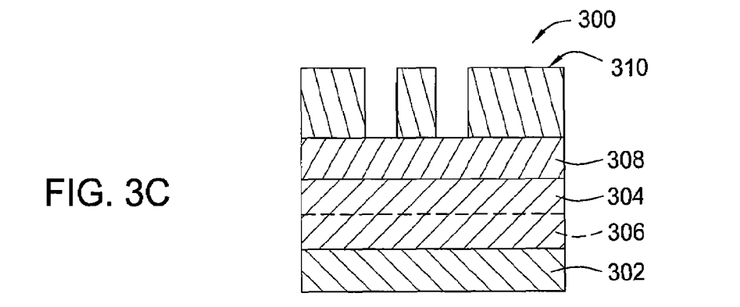

At step 206, a resist layer 310 is patterned over the carbon hard mask layer 308, as commonly known in the art. The resist layer may be patterned by any suitable method.

Figure 3D:
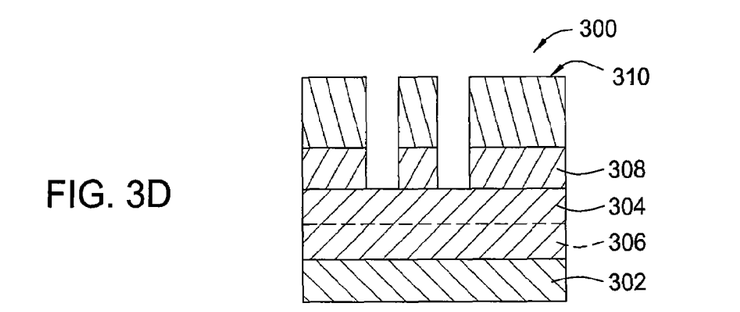

At step 208, the carbon hard mask layer 308 is etched using the patterned photoresist mask 310 layer as an etch mask, as shown in FIG. 3D.

In one embodiment, the carbon hard mask layer 308 may be etched by providing hydrogen bromide (HBr) at a rate of 20 to 200 sccm, oxygen ($O_2$) at a rate of 10 to 40 sccm (i.e., a HBr:$O_2$ flow ratio ranging from 1:2 to 20:1), and argon (Ar) at a rate of 20 to 200 sccm, applying power to an inductively coupled antenna between 200 to 1500 W, applying a cathode bias power between 50 and 200 W, and maintaining a wafer temperature between 50 and 200 degrees Celsius at a pressure in the process chamber between 2 and 20 mTorr. One process recipe provides HBr at a rate of 60 sccm, $O_2$ at a rate of 26 sccm, (i.e., a HBr:$O_2$ flow ratio of about 2.3:1), and Ar at a rate of 60 sccm, applies 600 W of power to the antenna, 60 W of a bias power, maintains a wafer temperature of 80 degrees Celsius, and maintains a pressure of 4 mTorr.

Figure 3E:
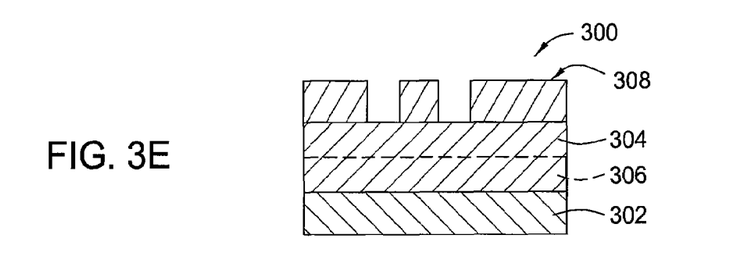

At optional step 210, the photoresist mask 310 is removed from the carbon hard mask layer 308, as shown in FIG. 3E. In one embodiment, the photoresist mask 310 may be removed contemporarily with the etching of the carbon hard mask layer 308 at step 208. In another embodiment, the photoresist mask 310 may be removed in-situ the hard mask etch chamber by exposure to an oxygen containing plasma. The photoresist mask 310 may alternatively be left on the film stack 300. The photoresist 310 will eventually be consumed during subsequent etch processes, or be removed with the patterned carbon hard mask layer 308 at step 214 as described below.

Figure 3F:
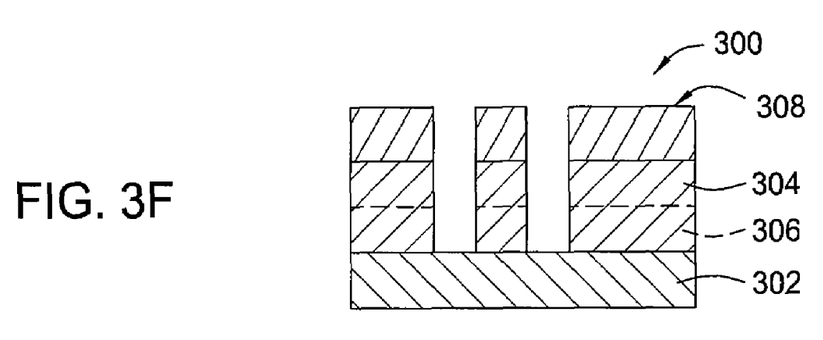

At step 212, the chromium layer 304 is etched using the patterned carbon hard mask layer 308 as an etch mask. FIG.

3F depicts the film stack 300 with the chromium layer 304 etched. In one embodiment, the etch step 212 utilizes a plasma formed from a chlorine containing gas and carbon monoxide (CO) introduced into the process chamber 100. Exemplary chlorine containing gas may include one or more of $Cl_2$, $BCl_3$, and HCl, among others.

In another embodiment, the chromium layer 304 is etched at step 212 by providing $C_{l2}$ at a rate of 50 to 1000 standard cubic centimeters per minute (sccm) and CO at a rate of 10 to 500 sccm. In yet another embodiment, the chromium layer 304 is etched by providing $Cl_2$ at a rate of 20 to 400 sccm and CO at a rate of 100 to 300 sccm . One specific process recipe provides $Cl_2$ at a rate of 300 sccm , CO at a rate of 150 sccm. The pressure in the process chamber is maintained at between 2 and 50 mTorr, and in one embodiment, between 2 and 10 mTorr. In yet another embodiment, the pressure is maintained at around 3 mTorr.

During the chromium layer etch step 212, a pulsed bias power is applied to the support pedestal 124 to bias the substrate 122. In a first example, the substrate 122 is biased with a pulsed RF power of less than about 100 W, and in a second example, the substrate 122 is biased with a pulsed RF of about 8 W. The bias power may be pulsed with a frequency and duty cycle as described above, for example, with a frequency in the range of about 1 to about 10 kHz, and with a duty cycle between about 10 to about 95 percent. The pulsed bias power may be DC and/or RF. In another embodiment, the biasing source 140 is provides pulsed RF power between about 5 to about 25 W, at a frequency between about 2 to about 5 kHz, with a duty cycle between about 80 to about 95 percent. In yet another embodiment, the biasing source provides a pulsed RF power of about 10 W.

During step 212, plasma, formed of the process gases, is maintained in the chamber 100 by applying RF power of between about 100 to about 1000 W from the plasma power source 112 to the antenna 110. In another example, the plasma is maintained by applying RF power of between 100 to about 500 W. In yet another embodiment, the RF power is applied at around 300 W. It is contemplated that the plasma may be ignited by any number of methods.

The chromium layer 304 exposed on the substrate 122 through the patterned carbon hard mask layer 308 is etched until an endpoint is reached. The endpoint may be determined by time, optical interferometry, chamber gas emission spectrograph or by other suitable methods.

Figure 3G:
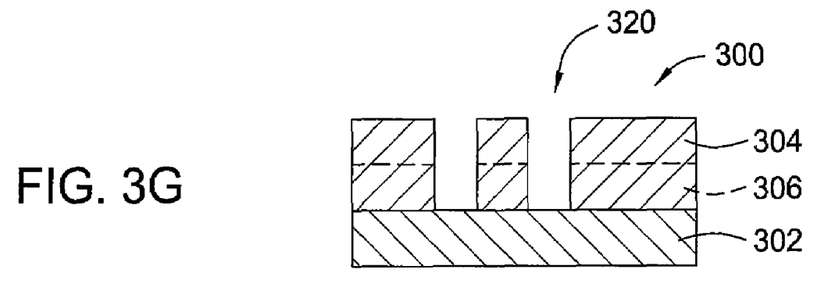

At step 214, the carbon hard mask layer 308 is removed to form a photomask 320. In another embodiment, the carbon hard mask layer 308 may be removed in-situ the processing chamber 170 in which the etching step 212 was performed. For example, a carbon hard mask layer 308 may be removed by exposure to an oxygen containing plasma in-situ processing chamber 170 following the chromium layer etch. In another embodiment, the carbon hard mask layer 308 may be removed using a plasma formed from hydrogen bromide and oxygen. A $HBr:O_2$ flow ratio may range between about 1:10 to 10:1. Argon may also be present in the plasma. In another embodiment, the plasma is energized with a source power of 20 to 1000 W and a bias power of 0 to 300 W, while the temperature of the substrate is maintained between about 20 to about 80 degrees Celsius. Alternatively, a plasma formed from hydrogen ($H_2$) or a mixture of oxygen and a diluent gas such as argon (Ar) may be used to remove the carbon hard mask layer 308.

Thus, a method for etching chromium layer has been provided that advantageously improves critical dimension transfer by high selectivity of the chromium layer to the carbon hard mask layer. Accordingly, the method of etching a chromium layer with improved CD control described herein advantageously facilitates fabrication of photomask suitable for patterning features having small critical dimensions.

While the foregoing is directed to embodiments of the present invention, other and further embodiments of the invention may be devised without departing from the basic scope thereof, and the scope thereof is determined by the claims that follow.

What is claimed is:

1. A method of fabricating a photomask, comprising:
   depositing a carbon layer on an optically transparent substrate having a chromium layer;
   depositing and patterning a photoresist layer on the carbon layer;
   etching the carbon layer through the photoresist layer to form a patterned hard mask;
   etching the chromium layer in the presence of a plasma formed from a process gas containing $BCl_3$ and CO through the carbon hard mask; and
   removing the hard mask.

2. The method of claim 1, wherein providing the process gas comprises:
   flowing about 10 to about 500 sccm of CO into the processing chamber.

3. The method of claim 1, wherein providing the process gas comprises:
   flowing about 100 to about 300 sccm of CO into the processing chamber.

4. The method of claim 1, further comprising:
   removing the patterned photoresist layer contemporarily with etching the carbon layer.

5. The method of claim 1 further comprising:
   removing the patterned photoresist layer while etching the chromium layer.

6. The method of claim 1 further comprising:
   removing the patterned photoresist layer while removing the hard mask.

7. The method of claim 1, wherein the hard mask is removed in-situ a processing chamber in which the chromium layer is etched.

8. A method of fabricating a photomask, comprising:
   depositing an α-carbon layer on an optically transparent substrate having a chromium layer;
   depositing and patterning a photoresist layer on the α-carbon layer;
   etching the α-carbon layer through the photoresist layer to form a patterned hard mask;
   etching the chromium layer in the presence of a plasma formed from a process gas containing at least $BCl_3$ and CO through the carbon hard mask, wherein the substrate is biased during chromium etching; and
   removing the hard mask.

9. The method of claim 8, wherein etching the chromium layer further comprises:
   flowing about 150 sccm of CO into the processing chamber;
   maintaining chamber pressure at around 3 mTorr;
   applying a plasma source power at around 300 Watts; and
   supplying a plasma bias power at around 8 Watts.

10. The method of claim 8 further comprising:
    removing the patterned photoresist layer contemporarily with etching the carbon layer.

11. The method of claim 8 further comprising:
    removing the patterned photoresist layer while at least one of etching the chromium layer or removing the hard mask.

12. The method of claim 8, wherein etching the chromium layer further comprises:
    flowing about 10 to about 500 sccm of CO into the processing chamber.

13. The method of claim 8, wherein etching the chromium layer further comprises:
    flowing about 100 to about 300 sccm of CO into the processing chamber.

14. The method of claim 8, wherein the hard mask is removed in-situ a processing chamber in which the chromium layer is etched.

15. The method of claim 8, wherein biasing the substrate during etching the chromium layer further comprises:
    biasing the substrate with a power of less than 100 W.

16. The method of claim 15, wherein the biasing the substrate during etching the chromium layer further comprises:
    pulsing the bias power.

17. A method of fabricating a photomask, comprising:
    depositing an α-carbon layer on an optically transparent substrate having a chromium layer;
    depositing and patterning a photoresist layer on the α-carbon layer;
    etching the α-carbon layer through the photoresist layer to form a patterned hard mask;
    etching the chromium layer in the presence of a plasma formed from a process gas containing CO and $BCl_3$ through the carbon hard mask, wherein the substrate is biased with a power of less than 100 W during chromium etching; and
    removing the hard mask.

18. The method of claim 17, wherein the hard mask is removed in-situ a processing chamber in which the chromium layer is etched.

* * * * *

UNITED STATES PATENT AND TRADEMARK OFFICE
CERTIFICATE OF CORRECTION

PATENT NO.         : 7,718,539 B2                                        Page 1 of 1
APPLICATION NO.   : 11/565271
DATED              : May 18, 2010
INVENTOR(S)        : Kumar It is certified that error appears in the above-identified patent and that said Letters Patent is hereby corrected as shown below:

In the Detailed Description:

Column 6, Line 6, please delete "a-carbon" and insert --$\alpha$ -carbon-- therefor;

Column 7, Line 11, please delete "20" and insert --200-- therefor;

Column 7, Line 58, please delete "20" and insert --200-- therefor.

Signed and Sealed this

Seventeenth Day of August, 2010

David J. Kappos
*Director of the United States Patent and Trademark Office*